(12) United States Patent
Kurihara et al.

(10) Patent No.: US 7,679,372 B2
(45) Date of Patent: Mar. 16, 2010

(54) TEST APPARATUS

(75) Inventors: Yasushi Kurihara, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 153 days.

(21) Appl. No.: 11/945,276

(22) Filed: Nov. 27, 2007

(65) Prior Publication Data

US 2008/0297165 A1 Dec. 4, 2008

Related U.S. Application Data

(63) Continuation of application No. PCT/JP2006/313550, filed on Jul. 7, 2006.

(30) Foreign Application Priority Data

Jul. 7, 2005 (JP) ............................. 2005-198559

(51) Int. Cl.
*G01R 31/00* (2006.01)
(52) U.S. Cl. ........................ 324/537; 324/765; 324/73.1
(58) Field of Classification Search ................. 324/537, 324/765, 73.1
See application file for complete search history.

(56) References Cited

U.S. PATENT DOCUMENTS

| 7,042,243 | B2 * | 5/2006 | Matsumoto | ................. 324/763 |
| 2002/0036513 | A1 * | 3/2002 | Hashimoto | ................. 324/765 |

FOREIGN PATENT DOCUMENTS

| JP | 63-101782 | 5/1988 |
| KR | 0363936 | 12/2002 |
| WO | 99/27376 | 6/1999 |
| WO | 03/008985 | 1/2003 |

OTHER PUBLICATIONS

Korean Office Action issued for Application No. 10-2008-7001295, mailed Aug. 27, 2009, and English translation thereof, 7 pages.

* cited by examiner

*Primary Examiner*—Vincent Q Nguyen
(74) *Attorney, Agent, or Firm*—Osha • Liang LLP

(57) ABSTRACT

A driver for supplying a test signal to a device under test is shared by a plurality of terminals. In this way, the cost and time required for the test of the device under test can be reduced.

A testing apparatus 10 relating to the present invention includes a test signal generating section 130 that generates a test signal to be supplied to a device under test 20, a driver 140 that outputs the test signal, a switch 150 that is disposed on a wire between the driver 140 and a first terminal of the device under test 20, a switch 160 that is disposed on a wire between the driver 140 and a second terminal of the device under test 20, and a connection control section 100 that (i) turns on the switch 150 and turns off the switch 160 when the test signal is supplied to the first terminal of the device under test 20, and (ii) turns off the switch 150 and turns on the switch 160 when the test signal is supplied to the second terminal of the device under test 20.

10 Claims, 8 Drawing Sheets

US 7,679,372 B2

TEST APPARATUS

CROSS REFERENCE

This is a continuation application of PCT/JP2006/313550 filed on Jul. 7, 2006 which claims priority from a Japanese Patent Application NO. 2005-198559 filed on Jul. 7, 2005, the contents of which are incorporated herein by reference.

TECHNICAL FIELD

The present invention relates to a testing apparatus. More particularly, the present invention relates to a testing apparatus which inputs a signal into a device, and judges whether the device passes or fails a test based on a signal output from the device in response to the input signal.

RELATED ART

A recent wide-spread use of small-sized electronic devices such as mobile phones has increasingly intensified the demand for smaller, thinner, more highly integrated and larger-capacity LSI packages. Such demand has been conventionally satisfied by using multi-chip packages (MCPs). The technique of MCPs enables a plurality of different LSI chips to be laminated over each other within an LSI package. Here, FIG. 6 illustrates an example of an LSI package 600 which is formed by using the MCP technique.

The LSI package 600 includes therein a DRAM 610, an SRAM 620 and a flash memory 630. The DRAM 610, SRAM 620 and flash memory 630 are laminated in this order. The DRAM 610, SRAM 620 and flash memory 630 are respectively connected to input/output terminals. The input/output terminals are arranged on, for example, the bottom surface of the package by using the technology such as Ball Grid Array (BGA).

In order to judge whether such an LSI package passes or fails a test, it is required to judge whether each of the laminated LSI chips passes or fails the test. Therefore, a conventional testing apparatus outputs a test signal to each of the LSI chips to judge whether the corresponding one of the LSI chips passes or fails the test. Here, the test signal directed to each LSI chip is output for example, from a signal generator which is provided within the testing apparatus in association with the corresponding LSI chip.

FIG. 7 illustrates an example of a conventional testing apparatus 700. The following explains the functions of the testing apparatus 700 for testing the DRAM 610 and flash memory 630, excluding the SRAM 620 with reference to FIG. 7. The testing apparatus 700 requires testing units including two groups. Specifically speaking, the testing apparatus 700 requires a testing unit 710 including a first group associated with the DRAM 610 and a testing unit 720 including a second group associated with the flash memory 630. The testing unit 710 including the first group supplies signals output from test signal generating sections to the DRAM 610 by using drivers. The testing unit 710 including the second group judges whether the DRAM 610 passes or fails a test based on the comparison done by logic comparing sections between the resulting signals output from the DRAM 610 and expected value signals. On the other hand, the testing unit 720 supplies signals output from test signal generating sections to the flash memory 630 by using drivers. The testing unit 720 judges whether the flash memory 630 passes or fails a test based on the comparison done by logic comparing sections between the resulting signals output from the flash memory 630 and expected value signals.

Here, the testing apparatus includes therein, in practice, several thousand channels for the test signal generating sections, drivers, comparators, and logic comparators of the testing units 710 and 720 for the purpose of testing many DUTs in parallel.

Since no prior art documents have been found, such documents are not mentioned here.

FIG. 8 illustrates the progress of tests started simultaneously by the testing apparatus 700 for the DRAM 610 and flash memory 630. When testing the DRAM 610 and flash memory 630 in parallel, the testing apparatus 700 requires an approximately several times longer time for the test of the flash memory 630 than the test of the DRAM 610, since the access speed for the DRAM 610 is very high. If such occurs, the testing unit 710 can not start the next test and remains in the idle state until the testing unit 720 completes the test of the flash memory 630.

In view of this, the object of the present invention is to provide a testing apparatus which is capable of solving the above-mentioned problem. This object is achieved by combining the features recited in the independent claims. The dependent claims define further effective specific example of the present invention.

The present invention provides a testing apparatus for testing a device under test. The testing apparatus includes a test signal generating section that generates a test signal to be supplied to the device under test, a driver that outputs the test signal, a first switch that is disposed on a wire between the driver and a first terminal of the device under test, a second switch that is disposed on a wire between the driver and a second terminal of the device under test, and a connection control section that (i) turns on the first switch and turns off the second switch when the test signal is supplied to the first terminal of the device under test, and (ii) turns off the first switch and turns on the second switch when the test signal is supplied to the second terminal of the device under test.

SUMMARY

The testing apparatus may further include a first voltage output section that is connected to a wire between the first switch and the first terminal when the first switch is off, to supply a predetermined first reference voltage to the first terminal, and a second voltage output section that is connected to a wire between the second switch and the second terminal when the second switch is off, to supply a predetermined second reference voltage to the second terminal.

The first voltage output section may include a first DA converter that outputs the first reference voltage based on a given value, and a third switch that connects an output from the DA converter to the first terminal when the first switch is off, and the second voltage output section may include a second DA converter that outputs the second reference voltage based on a given value, and a fourth switch that connects an output from the DA converter to the second terminal when the second switch is off.

The testing apparatus may further include a shared DA converter that (i) outputs the first reference voltage when the first switch is off, and (ii) outputs the second reference voltage when the second switch is off. Here, the first voltage output section may connect an output from the shared DA converter to the first terminal when the first switch is off, and the second voltage output section may connect the output from the shared DA converter to the second terminal when the second switch is off.

When switching the first switch from an on state to an off state, the connection control section may cause the test signal generating section to output the first reference voltage, and may turn off the first switch in such a state that the first voltage output section supplies the first reference voltage to the first terminal.

The testing apparatus may further include a test head that is mounted with a testing module including therein the test signal generating section and the driver, and a performance board that connects the driver to a terminal of the device under test, wherein the performance board is changed in association with a type of the device under test. Here, the performance board may include therein the first switch, the second switch, the first voltage output section and the second voltage output section.

When the same test signal is supplied to the first and second terminals, the connection control section may turn on both of the first and second switches.

Another embodiment of the present invention provides a device interface apparatus connected to a test head of a testing apparatus. Here, the device interface apparatus relays a connection between the test head and a device under test. The device interface apparatus includes a first switch that opens and closes a connection between a driver of the test head and a first terminal of the device under test, a second switch that opens and closes a connection between the driver of the test head and a second terminal of the device under test, a first voltage output section that supplies a predetermined voltage via an open/closure switch to the first terminal of the device under test, and a second voltage output section that supplies a predetermined voltage via an open/closure switch to the second terminal of the device under test. Here, one end of the first switch and one end of the second switch are connected to the driver, the other end of the first switch is connected to the first terminal of the device under test, and the other end of the second switch is connected to the second terminal of the device under test.

Here, all the necessary features of the present invention are not listed in the summary. The sub-combinations of the features may become the invention.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
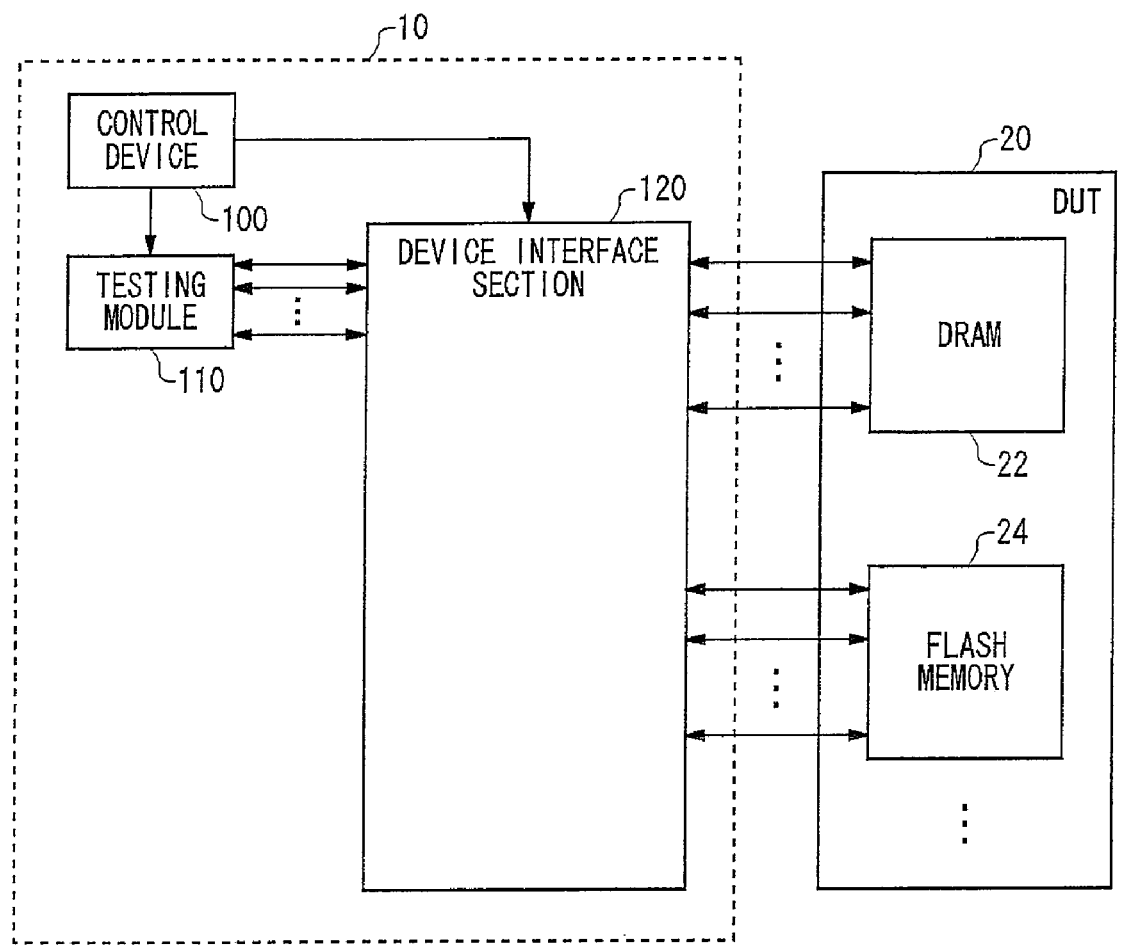
FIG. 1 illustrates the overall configuration of a testing apparatus 10 relating to an exemplary embodiment of the present invention.

FIG. 1 illustrates the overall configuration of a testing apparatus 10 relating to an exemplary embodiment of the present invention. The testing apparatus 10 includes therein a control device 100, a testing module 110, and a device interface section 120. The control device 100 controls the entire process of a test to judge weather a device under test 20 passes or fails the test. For example, the control device 100 is shown as an example of a connection control section relating to the present invention. The control device 100 controls the connection between the testing module 110 and the device under test 20 by way of the device interface section 120. The testing module 110 generates test signals, and supplies the generated test signals to the device under test 20 via the device interface section 120.

The device interface section 120 controls the connection between the testing module 110 and the device under test 20. To be specific, the device interface section 120 firstly connects the testing module 110 to the DRAM 22 in the present exemplary embodiment. After the test on the DRAM 22 is completed, the device interface section 120 connects the testing module 110 to the flash memory 24. By doing this, the testing apparatus 10 aims to reduce the idle time of the testing module 110.

Figure 2:
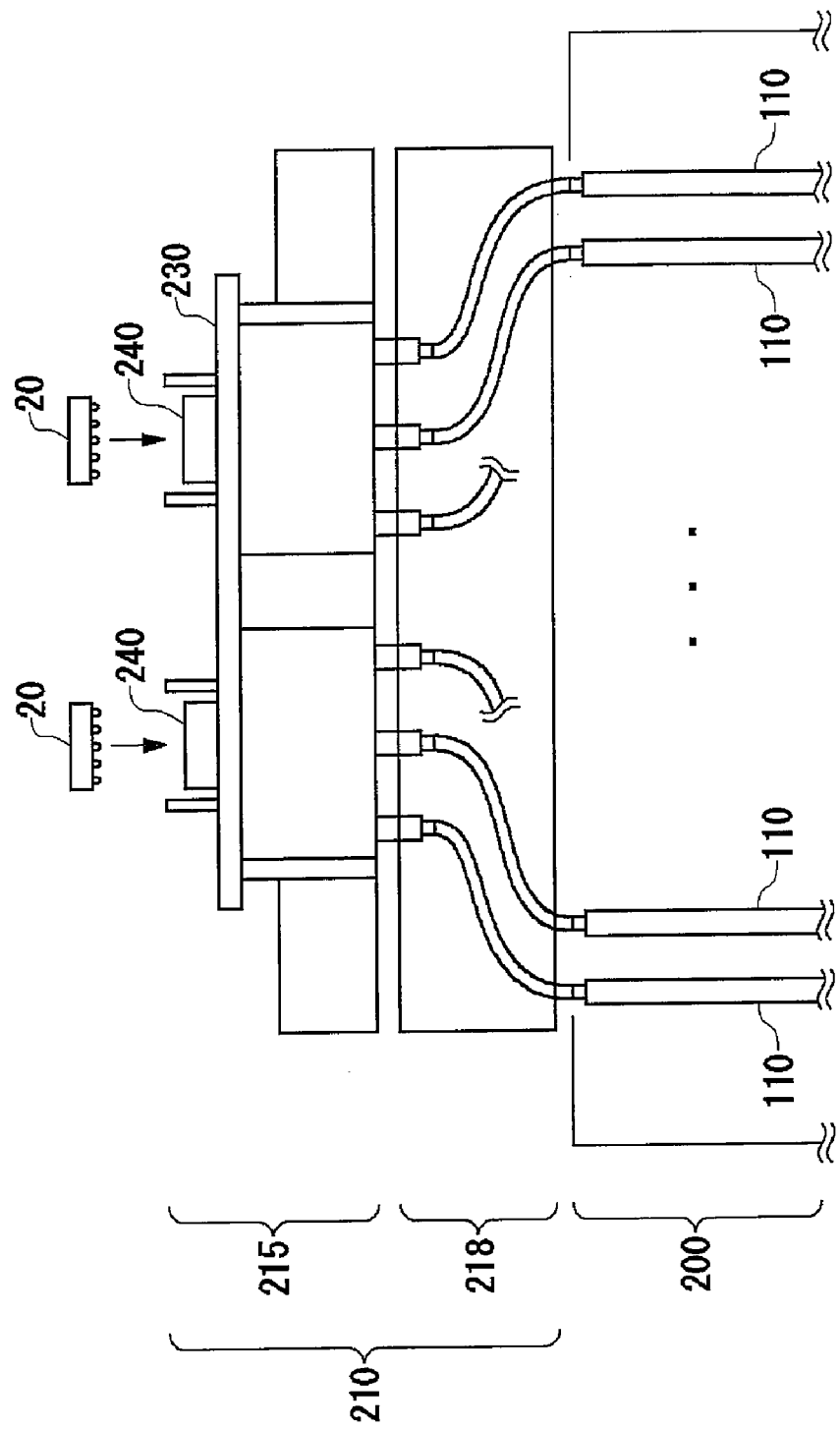
FIG. 2 illustrates the configuration of a device interface section 120 relating to the present exemplary embodiment.

FIG. 2 illustrates the configuration of the device interface section 120 relating to the present exemplary embodiment. The device interface section 120 includes a performance board 210. The performance board 210 has a device specific adapter (DSA) section 215 and a mother board (MB) section 218. The performance board 210 is placed on a test head 200 mounted with a plurality of testing modules 110. Note that the performance board 210 may be referred to as "HIFIX".

The DSA section 215 is a type-dependent changeable section which is manufactured uniquely to the type of the DUT 20. The DSA section 215 is changed in association with the type of the DUT 20. The DSA section 215 includes a plurality of sockets 240 and a socket board 230. Each of the sockets 240 is mounted with the DUT 20 thereon, and electrically connects the respective terminals of the DUT 20 to the wires on the socket board 230. The socket board 230 electrically connects, by means of the wires on the substrate thereof, the terminals of the sockets 240 to a plurality of connectors (first connectors). The first connectors connect the DSA section 215 to the MB section 218. In this way, the socket board 230 guides the wires extending from the respective terminals of each of the sockets 240 to a connector which is appropriately positioned for connecting the wires to the test head 200.

The MB section 218 is mounted with the DSA section 215 thereon, and is connected to the plurality of connectors of the DSA section 215 by means of a plurality of connectors. The MB section 218 electrically connects a plurality of connectors to the plurality of testing modules 110 by way of cables such as coaxial cables. In this way, the MB section 218 electrically connects the DSA section 215 to the plurality of testing modules 110.

Figure 3:
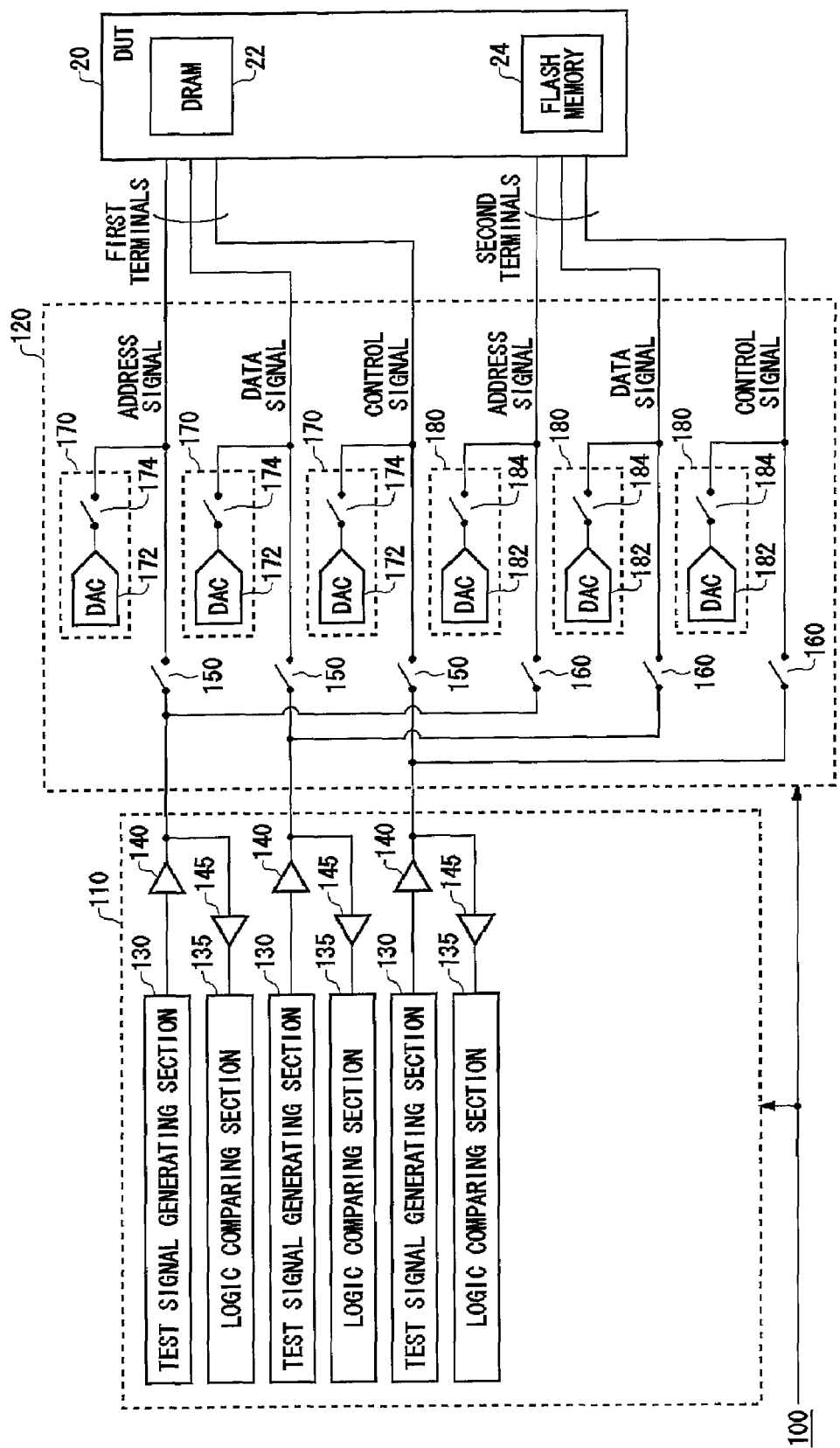
FIG. 3 illustrates the functional configurations of a testing module 110 and the device interface section 120 relating to the present exemplary embodiment.

FIG. 3 illustrates the functional configurations of the testing module 110 and device interface section 120 relating to the present exemplary embodiment. According to the present example, the device under test 20, which is to be tested, includes the DRAM 22 and flash memory 24. The DRAM 22 is connected to the device interface section 120, which is provided outside, by means of a plurality of first terminals. The flash memory 24 is connected to the device interface section 120, which is provided outside, by means of a plurality of second terminals. To be more specific, the DRAM 22 and flash memory 24 each include, for example, a terminal for an address signal, a terminal for a data signal and a terminal for a control signal. The testing apparatus 10 tests the device under test 20 by inputting a test signal into each of these terminals.

The testing module 110 includes a combination of a test signal generating section 130 and a driver 140 in association with each of the terminal for the address signal, the terminal for the data signal and the terminal for the control signal. The combinations of the test signal generating section 130 and driver 140 are used for both of the test on the DRAM 22 and the test on the flash memory 24. In other words, the combinations of the test signal generating section 130 and driver 140 test the DRAM 22 at a certain time point and test the flash memory 24 at a different time point, in accordance with the control made by the control device 100, for example. As mentioned above, the combinations of the test signal generating section 130 and driver 140 are configured so as to be used for both of the tests in the present exemplary embodiment. With such a configuration, the present exemplary embodiment aims to improve the operational efficiency of the testing apparatus 10 as a whole, thereby reducing the cost and processing time.

Each test signal generating section 130 generates a test signal to be supplied to the device under test 20. Each driver 140 outputs the test signal generated by the corresponding test signal generating section 130 to the device under test 20 via the device interface section 120. Here, the testing module 110 may additionally include combinations of a logic comparing section 135 and a comparator 145. An output signal from the device under test 20 is input into each comparator 145. Each logic comparing section 135 judges whether the device under test 20 passes or fails a test by comparing the output signal from the corresponding comparator 145 with a predetermined expected value signal.

The device interface section 120 includes, in the performance board 210, switches 150 and switches 160. The switches 150 and 160 are used to provide the connection between the drivers 140 and the terminals of the device under test 20. To be specific, each switch 150 is shown as an example of a first switch relating to the present invention, and is disposed on the wire between the corresponding driver 140 and the corresponding first terminal of the device under test 20. Each switch 160 is shown as an example of a second switch relating to the present invention, and is disposed on the wire between the corresponding driver 140 and the corresponding second terminal of the device under test 20. The device interface section 120 turns on the switches 150 and turns off the switches 160 when supplying the test signals to the first terminals of the device under test 20, in accordance with the control made by the control device 100. On the other hand, the device interface section 120 turns off the switches 150 and turns on the switches 160 when supplying the test signals to the second terminals of the device under test 20, in accordance with the control made by the control device 100.

In addition, the device interface section 120 includes, in the performance board 210, voltage output sections 170 and voltage output section 180. Each voltage output section 170 is shown as an example of a first voltage output section and supplies a predetermined first reference voltage to the corresponding first terminal. Each voltage output section 180 is shown as an example of a second voltage output section and supplies a predetermined second reference voltage to the corresponding second terminal. The voltage output sections 170 are connected to the wires between the switches 150 and the first terminals when the switches 150 are off. To be specific, each voltage output section 170 includes a DA converter 172 and a switch 174. The DA converter 172 is shown as an example of a first DA converter and outputs the first reference voltage based on a given value. The switch 174 is shown as an example of a third switch and connects the output from the DA converter 172 to the corresponding first terminal when the corresponding switch 150 is off. Here, the first reference voltage is set at a value appropriate to bring the DRAM 22 into a stable standby state. With such a configuration, the DRAM 22 can remain in a stable state even while the DRAM 22 is not being tested.

The voltage output sections 180 are connected to the wires between the switches 160 and the second terminals when the switches 160 are off. To be specific, each voltage output section 180 includes a DA converter 182 and a switch 184. The DA converter 182 outputs the second reference voltage based on a given value. The switch 184 is shown as an example of a fourth switch, and connects the output from the DA converter 182 to the corresponding second terminal when the corresponding switch 160 is off. Here, the second reference voltage may be different from the above-mentioned first reference voltage. The second reference voltage is set at a value appropriate to bring the flash memory 24 into a stable standby state. With such a configuration, the flash memory 24 can remain in a stable state even while the flash memory 24 is not being tested.

Here, a problem arises from the transition state of the testing apparatus 10 during the step in which the control device 100 turns off the switches 150 and turns on the switches 174. In detail, when the control device 100 first turns off the switches 150 and then turns on the switches 174, for example, the value of the voltage applied to the DRAM 22 is unstable during the in-between time period. This brings the DRAM 22 into an unstable state, and may even cause operational faults or failures in the DRAM 22. For the purpose of preventing this problem, the control device 100 turns on the switches 174 before turning off the switches 150. Even in this case, however, the DRAM 22 operates in an unstable manner when the voltages output from the test signal generating sections 130 are different from the voltages output from the DA converters 172. In light of these problems, it is preferable that the control device 100 firstly causes the test signal generating sections 130 to output the first reference voltages during the transition state in which the control device 100 switches the state of the switches 150 from the on state to the off state. The control device 100 subsequently causes the voltage output sections 170 to supply the first reference voltages to the first terminals by switching the state of the switches 174 from the off state to the on state. Following this, the control device 100 switches the state of the switches 150 from the on state to the off state. In the above-described manner, the device under test 20 can remain in a stable state even at the end and start of the tests. Furthermore, a desired resistance (for example, a resistance of several KΩ) may be connected in series between each DA converter 172 and the corresponding switch 174, so as to prevent the voltage level from becoming unstable during the transition in which the corresponding switches 150 and 174 are turned on/off. Similarly, a desired resistance (for example, a resistance of several KΩ which is sufficiently higher than the output impedance of each driver 140) may be connected in series between each DA converter 182 and the corresponding switch 184. When the voltage output sections 170 supply a zero voltage, the DA converters 172 and 182 may be omitted and the switches 174 and 184 may be connected to ground directly or via desired resistances Here, at least some of the functions of the device interface section 120 described above may be realized by the testing module 110, in place of the device interface section 120. For example, the testing module 110 may include the voltage output sections 170 and 180. In this case, the voltage output sections 170 and 180 may supply the voltages to the wires provided within the device interface section 120.

As described above, the testing apparatus 10 relating to the present exemplary embodiment includes the testing module 110 which has therein only one group. According to the present exemplary embodiment, the testing module constituted by the test signal generating sections 130 and drivers 140 can be shared by the respective LSI chips included in the MCP. Such a configuration can reduce the testing module to half, and improves the operational efficiency of the testing apparatus 10 as a whole, thereby reducing the cost and processing time. When the device under test 20 includes therein a plurality of LSI chips of the same type, rather than a plurality of LSI chips of different types, the testing apparatus 10 may supply the same set of test signals simultaneously to the LSI chips, as long as the output signals from the LSI chips do not interfere with each other. For example, when the testing apparatus 10 supplies the same set of test signals to the group of first terminals and the group of second terminals, the control device 100 controls both of the switches 150 and the switches 160 so as to be in the on state. In this way, the testing apparatus 10 can perform the tests in parallel, to further improve the operational efficiency.

The testing apparatus 10 can alternately test a plurality of DUTs, in addition to the plurality of LSI chips within the same DUT. For example, the test signal generating sections 130 and drivers 140 are connected to the terminals of a first DUT and the terminals of a second DUT. The switches 150 are disposed on the wires between the drivers 140 and the first DUT. The switches 160 are disposed on the wires between the drivers 140 and the second DUT. The control device 100 turns on the switches 150 and turns off the switches 160 when the test signals are supplied to the first DUT. On the other hand, the control device 100 turns off the switches 150 and turns on the switches 160 when the test signals are supplied to the second DUT. In this manner, the testing apparatus 10 can test a plurality of DUTs of different types more efficiently than in the related art.

Figure 4:
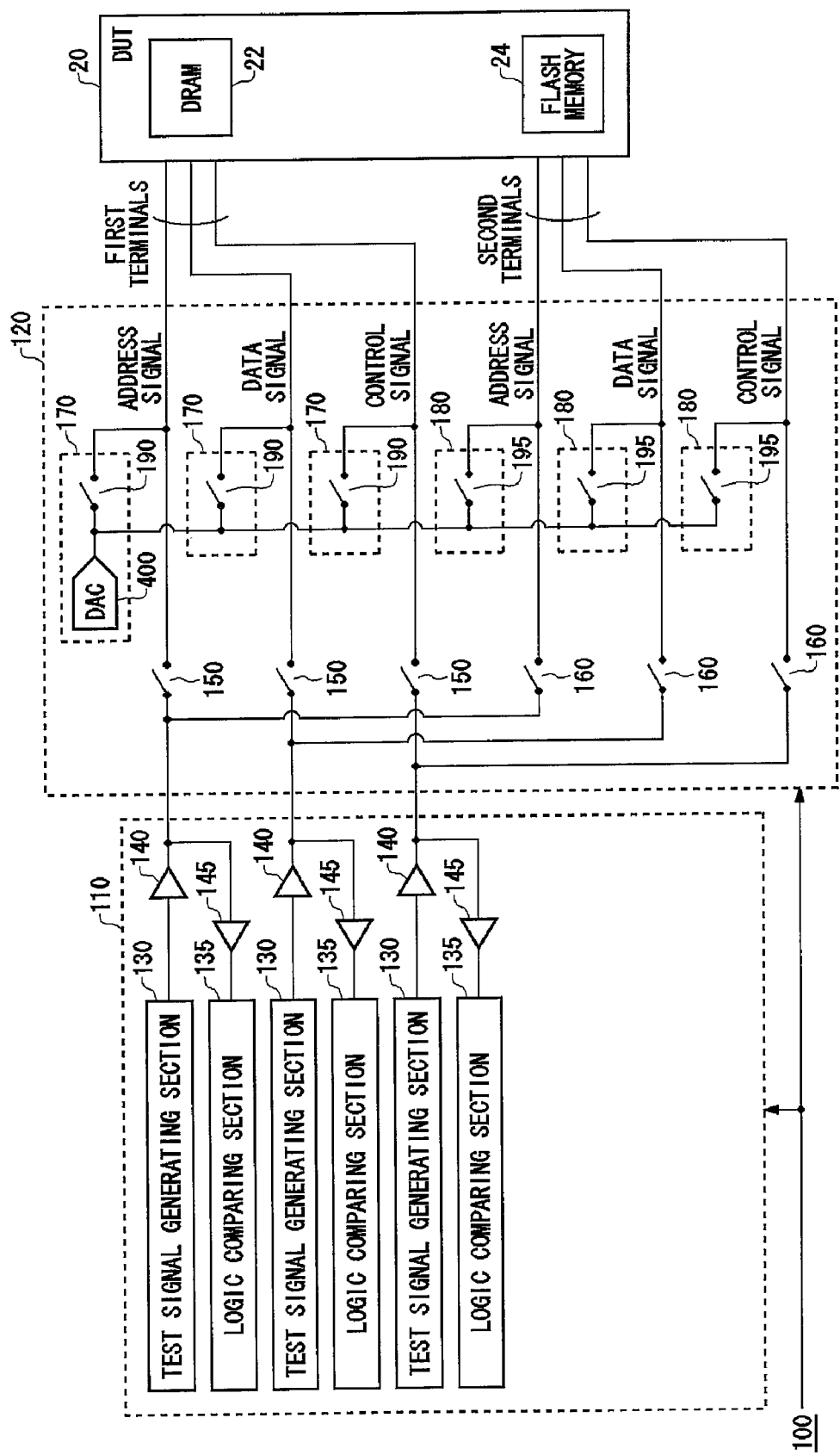
FIG. 4 illustrates the functional configurations of the testing module 110 and device interface section 120 relating to a modification example of the present exemplary embodiment.

FIG. 4 illustrates the functional configurations of the testing module 110 and the device interface section 120 relating to a modification example of the present exemplary embodiment. The testing module 110 relating to the present modification example is substantially the same as the testing module 110 shown in FIG. 3, and is thus not explained here. The device interface section 120 relating to the present modification example is different from the device interface section 120 shown in FIG. 3. In detail, the device interface section 120 relating to the present modification example may be configured without the DA converters 172, switches 174, DA converters 182 and switches 184. In place of these omitted constituents, the device interface section 120 relating to the present modification example includes a DA converter 400, switches 190 and switches 195.

The DA converter 400 is shown as an example of a shared DA converter relating to the present invention. When the switches 150 are off, the DA converter 400 outputs the first reference voltage. When the switches 160 are off, the DA converter 400 outputs the second reference voltage. In place of the switches 174, the voltage output sections 170 include the switches 190 disposed on the wires which connect the DA converter 400 and the first terminals. When the switches 150 are off, the voltage output sections 170 connect the output from the DA converter 400 to the first terminals by turning on the switches 190. Furthermore, a desired resistance (for example, a resistance of several KΩ) may be connected in series to the output end of the DA converter 400, in order to prevent the voltage level from becoming unstable during the transition in which the switches 150, 160, 190 and 195 are turned on/off.

In place of the switches 184, the voltage output sections 180 include the switches 195 disposed on the wires which connect the DA converter 400 and the second terminals. When the switches 160 are off, the voltage output sections 180 connect the output from the DA converter 400 to the second terminals by turning on the switches 195.

The above-described configuration illustrated in FIG. 4 also includes the testing module 110 which has therein only one group. The group of the test signal generating sections 130 and drivers 140 can be used for both of the test on the DRAM 22 and the test on the flash memory 24. As a result, the testing apparatus 10 as a whole can increase the operational efficiency. According to the present example, the DA converter 400 is also used for both of the test on the DRAM 22 and the test on the flash memory 24. Such a configuration can reduce the testing module of the testing apparatus 10 to half, thereby simplifying the circuit configuration.

Figure 5A:
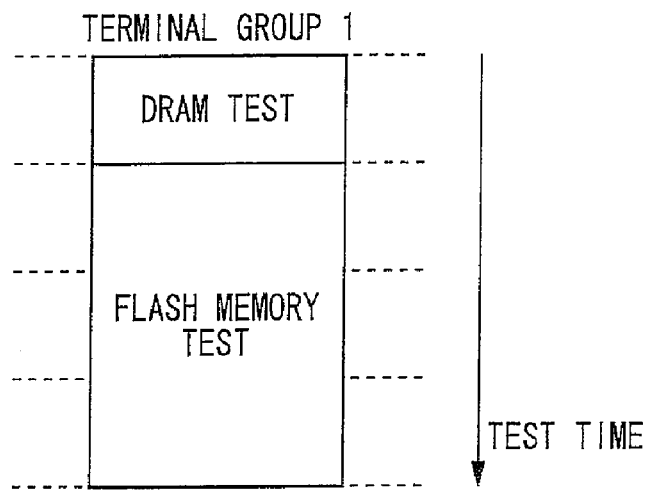
FIGS. 5A and 5B illustrate the progress of the tests performed by the testing apparatus 10 relating to the present exemplary embodiment and the testing apparatus 10 relating to the modification example of the present exemplary embodiment.
Figure 5B:
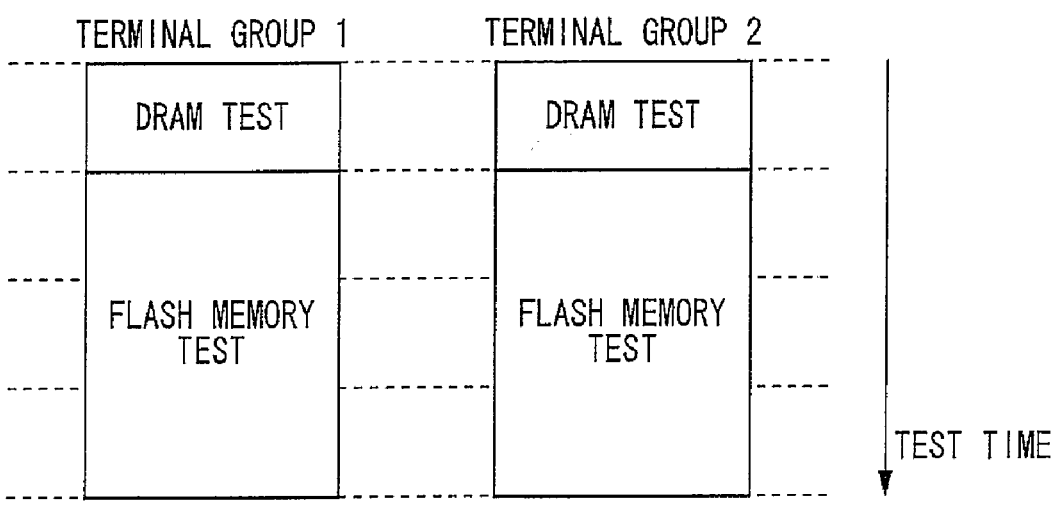
Figure 6:
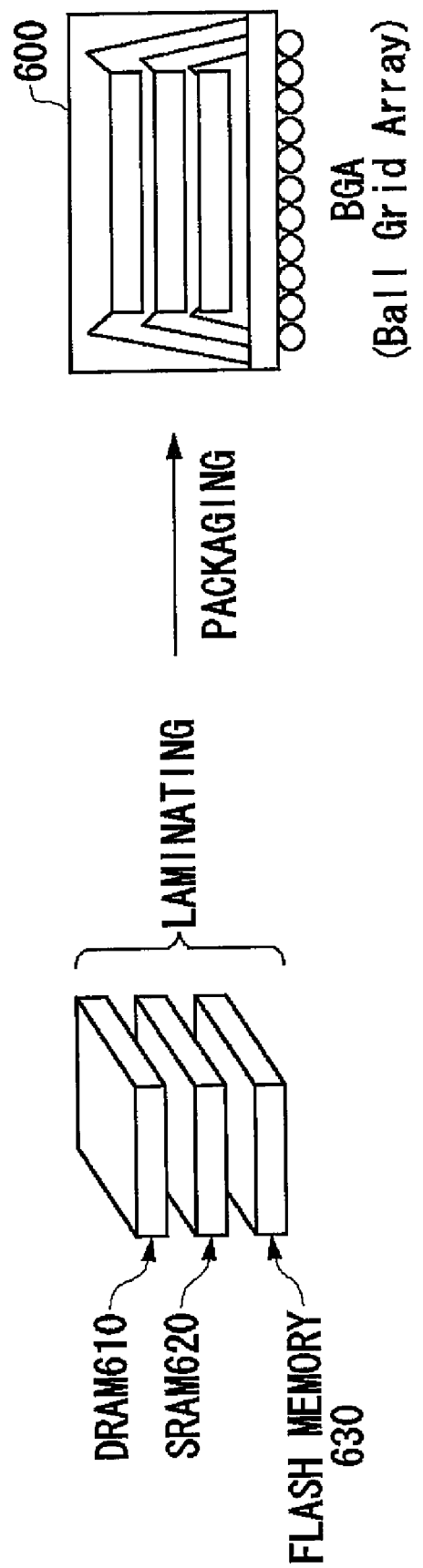
FIG. 6 illustrates an example of an LSI package 600 formed by using the MCP technique.
Figure 7:
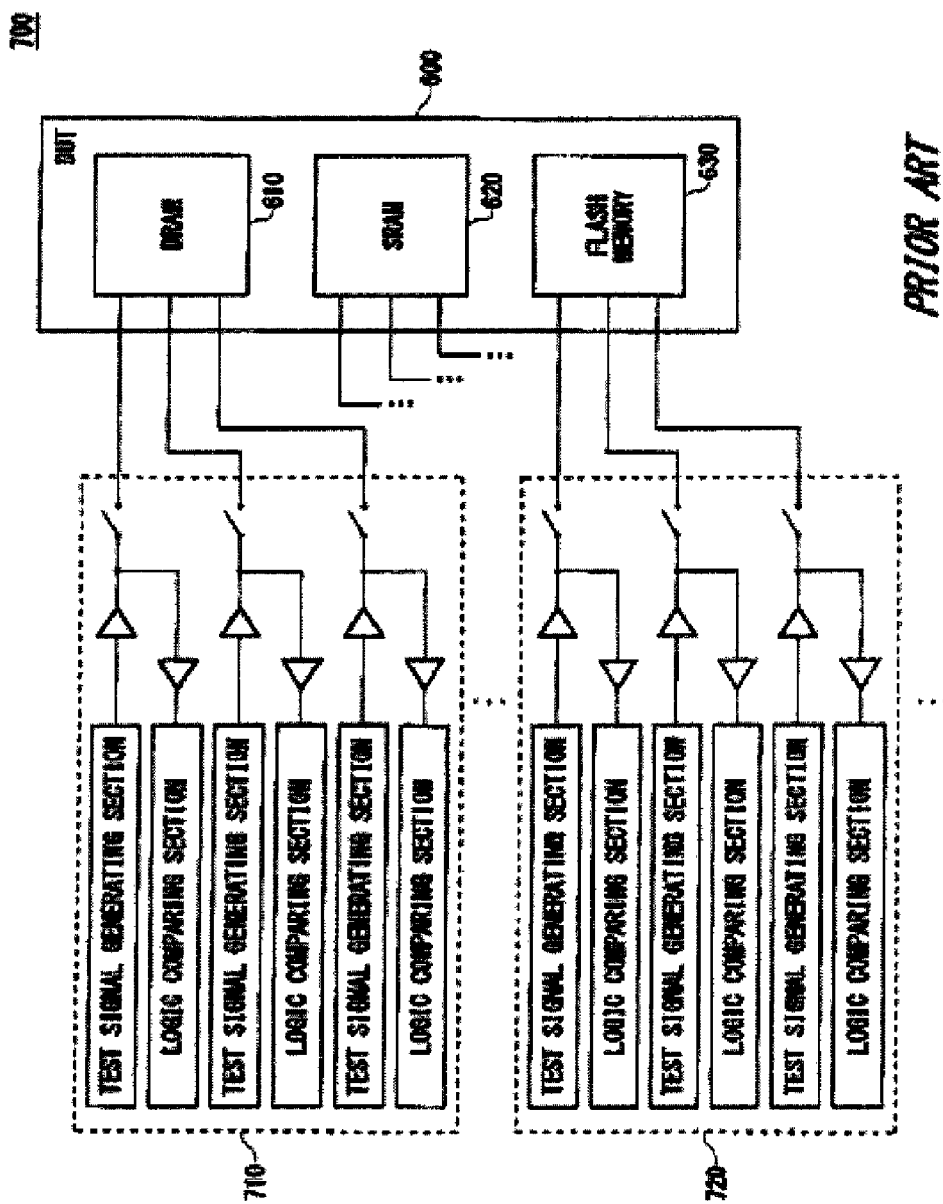
FIG. 7 illustrates an example of a conventional testing apparatus 700.
Figure 8:
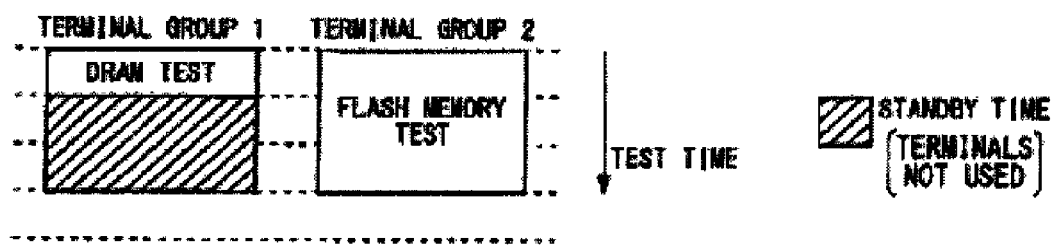
FIG. 8 illustrates the progress of the tests started simultaneously by the testing apparatus 700 for a DRAM 610 and a flash memory 630.

FIGS. 5A and 5B illustrate the progress of the test performed by the testing apparatus 10 relating to the present exemplary embodiment and the progress of a test performed by the testing apparatus 10 relating to a modification example of the present exemplary embodiment. In the case of the testing module 110 having therein only one group, the tests on the DRAM and flash memory provided within the MCP are performed consecutively as shown in FIG. 5A. As indicated in FIG. 5A, there is no idle time, which appears in FIG. 8. The tests only require a single group of resources such as the test signal generating sections 130 and drivers 140. In the case of the testing module 110 having therein two groups, in other words, in the case of the same number of groups of the test signal generating sections 130 and drivers 140 as in the conventional art, a plurality of groups of terminals can be tested in parallel as shown in FIG. 5B. Therefore, the throughput relating to the device tests can be approximately doubled.

According to the above description of the present invention with reference to the specific examples shown in FIGS. 3 and 4, the connection to the drivers 140 of the single channel can be switched between the two groups (the first terminals and the second terminals). However, the connection to the drivers 140 may be switched between three or more groups as long as the waveform quality is not degraded.

Furthermore, the group of switches 150 and the group of switches 160 may be controlled separately. If this is the case, the DSA section 215 may be shared by DUTs of different types.

While the embodiment of the present invention has been described, the technical scope of the invention is not limited to the above described embodiment. It is apparent to persons skilled in the art that various alternations and improvements can be added to the above-described embodiment. It is also apparent from the scope of the claims that the embodiments added with such alternations or improvements can be included in the technical scope of the invention.

As made clear in the above description, according to an aspect of the present invention, a driver for supplying a test signal to a device under test is shared by a plurality of terminals. This feature can reduce the time and cost for tests.

What is claimed is:

1. A testing apparatus for testing a device under test, comprising:
    a test signal generating section that generates a test signal to be supplied to the device under test;
    a driver that outputs the test signal;
    a first switch that is disposed on a wire between the driver and a first terminal of the device under test;
    a second switch that is disposed on a wire between the driver and a second terminal of the device under test;
    a connection control section that (i) turns on the first switch and turns off the second switch when the test signal is supplied to the first terminal of the device under test, and (ii) turns off the first switch and turns on the second switch when the test signal is supplied to the second terminal of the device under test;
    a first voltage output section that is connected to a wire between the first switch and the first terminal when the first switch is off, to supply a predetermined first reference voltage to the first terminal; and
    a second voltage output section that is connected to a wire between the second switch and the second terminal when the second switch is off, to supply a predetermined second reference voltage to the second terminal.

2. The testing apparatus as set forth in claim 1, wherein the first voltage output section includes:
    a first DA converter that outputs the first reference voltage based on a given value; and
    a third switch that connects an output from the DA converter to the first terminal when the first switch is off, and
    the second voltage output section includes:
        a second DA converter that outputs the second reference voltage based on a given value; and
        a fourth switch that connects an output from the DA converter to the second terminal when the second switch is off.

3. The testing apparatus as set forth in claim 1, further comprising
    a shared DA converter that (i) outputs the first reference voltage when the first switch is off, and (ii) outputs the second reference voltage when the second switch is off, wherein
    the first voltage output section connects an output from the shared DA converter to the first terminal when the first switch is off, and
    the second voltage output section connects the output from the shared DA converter to the second terminal when the second switch is off.

4. The testing apparatus as set forth in claim 1, wherein when switching the first switch from an on state to an off state, the connection control section:
    causes the test signal generating section to output the first reference voltage; and
    turns off the first switch in such a state that the first voltage output section supplies the first reference voltage to the first terminal.

5. The testing apparatus as set forth in claim 1, further comprising:
    a test head that is mounted with a testing module including therein the test signal generating section and the driver; and
    a performance board that connects the driver to a terminal of the device under test, the performance board being changed in association with a type of the device under test, wherein
    the performance board includes therein the first switch, the second switch, the first voltage output section and the second voltage output section.

6. The testing apparatus as set forth in claim 1, wherein when the same test signal is supplied to the first and second terminals, the connection control section turns on both of the first and second switches.

7. A device interface apparatus connected to a test head of a testing apparatus, the device interface apparatus relaying a connection between the test head and a device under test, the device interface apparatus comprising:
    a first switch that opens and closes a connection between a driver of the test head and a first terminal of the device under test;
    a second switch that opens and closes a connection between the driver of the test head and a second terminal of the device under test;
    a first voltage output section that supplies a predetermined voltage via an open/closure switch to the first terminal of the device under test; and
    a second voltage output section that supplies a predetermined voltage via an open/closure switch to the second terminal of the device under test, wherein
    one end of the first switch and one end of the second switch are connected to the driver, the other end of the first switch is connected to the first terminal of the device under test, and the other end of the second switch is connected to the second terminal of the device under test.

8. A testing apparatus for testing a plurality of devices under test, comprising:
    a testing module that includes a test signal generating section that generates a test signal to be supplied to the plurality of devices under test, a driver connected to the test signal generating section that outputs the test signal to supply the test signal to the device under test, and an evaluating section that evaluates the output signal from the device under test; and
    a device interface that relays a connection between the plurality of devices under test and the testing module in a manner such that the plurality of devices under test shares at least one of the test signal generating section, the driver, and the evaluating section,
    wherein, in a case where the test signal is not supplied to the devices under test from the driver, the device interface further includes a reference voltage output section for supplying to the plurality of devices under test a reference voltage for keeping the devices under test stabilized and relays the connection in a manner such that the plurality of devices under test share the reference voltage output section.

9. The testing apparatus as set forth in claim 8, wherein the plurality of devices under test each have a different access speed for the test signal.

10. The testing apparatus as set forth in claim 9, wherein the plurality of devices under test include at least two of a dynamic random access memory, a static random access memory, and a flash memory.

* * * * *